United States Patent [19]

Metcalf

[11] 4,021,732
[45] May 3, 1977

[54] CONVERTIBLE ELECTRIC TESTER FOR USE WITH A FLASHLIGHT AND INCLUDING A JACK PLUG WITH TUBULAR SHUNT

[76] Inventor: John W. Metcalf, 2728 Emmaus Ave., Zion, Ill. 60099

[22] Filed: May 27, 1975

[21] Appl. No.: 581,274

[52] U.S. Cl. .................... 324/53; 324/149; 339/19

[51] Int. Cl.² ............ G01R 31/02; G01R 1/06; H01R 31/08

[58] Field of Search ........... 324/51, 53, 72.5, 149, 324/19, 133; 339/19, 183, 222

[56] References Cited

UNITED STATES PATENTS

| 1,128,405 | 2/1915 | Brooks | 339/19 |
|---|---|---|---|
| 1,528,709 | 3/1925 | Trimble | 324/53 |
| 2,540,402 | 2/1951 | Mosier | 324/53 |
| 2,705,773 | 4/1955 | Ward | 324/51 X |
| 2,793,354 | 5/1957 | Heimbach | 339/19 |
| 2,846,644 | 8/1958 | Costello | 324/53 |
| 2,902,643 | 9/1959 | Pasquale | 324/53 |
| 3,145,337 | 8/1964 | Lipson | 324/53 |
| 3,182,277 | 5/1965 | Ashby | 339/19 |
| 3,493,915 | 2/1970 | Cox | 339/19 X |
| 3,618,065 | 11/1971 | Trip et al. | 339/19 X |
| 3,634,680 | 1/1972 | Myrah | 324/53 X |
| 3,775,677 | 11/1973 | Garrett et al. | 324/53 |
| 3,873,915 | 3/1975 | Hayes | 324/53 |

Primary Examiner—Gerard R. Strecker

[57] ABSTRACT

An electric tester usable for one type of test by tapping into the battery current of a flashlight, or for an alternate type of test as a shunt across the terminals of units in a power line to determine their conductivity. The tester is a jack with a plug having terminals suitable to tap as mentioned for the first type of test. For the second type the invention provides a connector bridging the terminals to convert the jack plug into a shunt applicable as stated.

1 Claim, 6 Drawing Figures

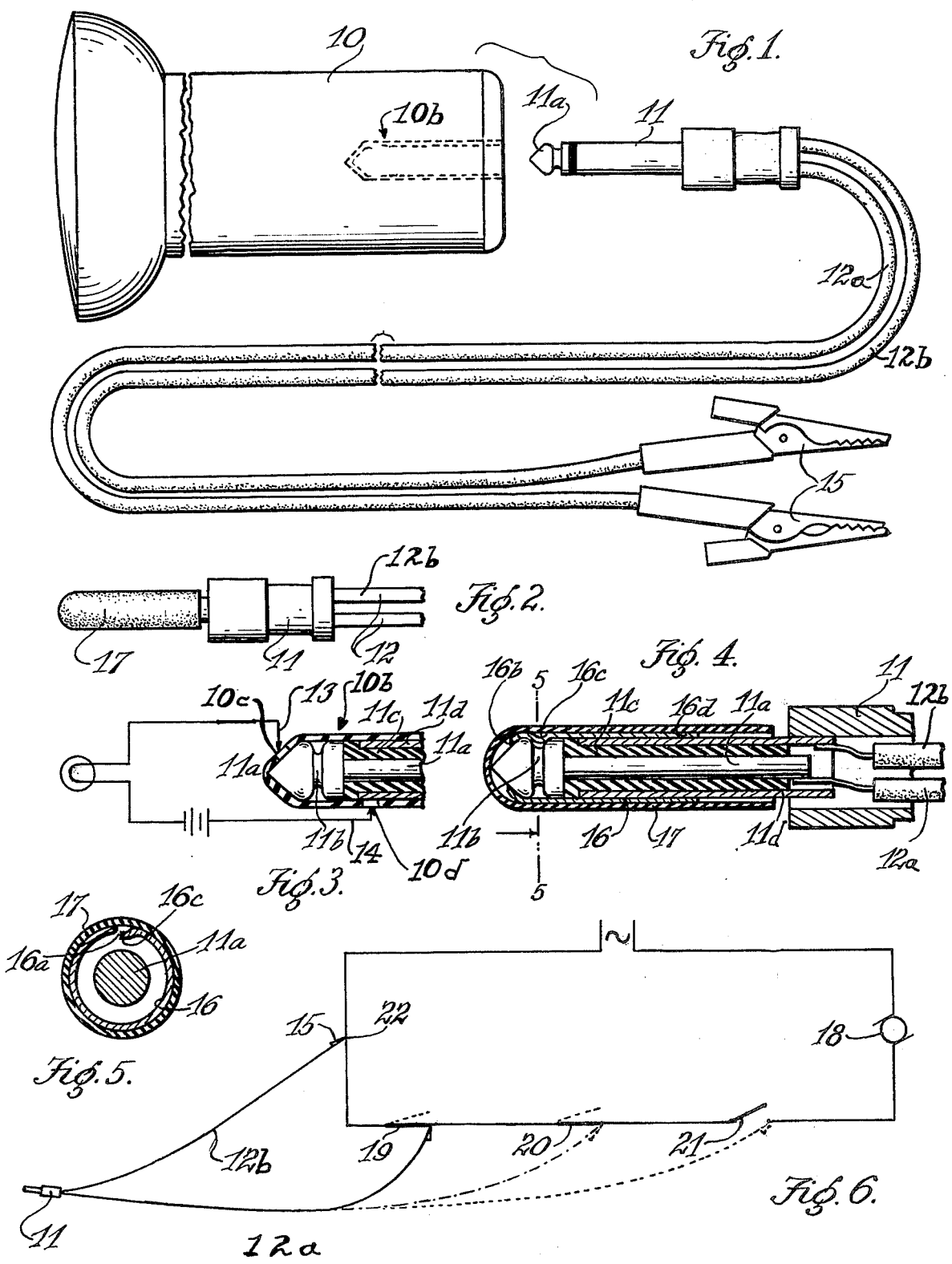

CONVERTIBLE ELECTRIC TESTER FOR USE WITH A FLASHLIGHT AND INCLUDING A JACK PLUG WITH TUBULAR SHUNT

This invention relates to devices for testing electric appliances and circuits, and more particularly to the manual or portable type. For simple use, a manual tester depends on a small battery for its current source; and testers are made where the facility of a battery is quickly procured by plugging the tester into the back of a flashlight made specially for that purpose, and whose bulb lights when the tester completes a circuit in the appliance or wiring tested. U.S. Pat. Nos. 2,846,644 and 3,775,677 are examples of such testers. Manual testers are also made which use the current in a power line for finding defects in the line or tracing defective switches, or other units in the same. A service man therefore finds it necessary to carry both types of the testers mentioned in order to meet different conditions, and use one or the other tester.

In view of the above situation, it is one object of the present invention to provide a tester which incorporates simple means for testing either with the flashlight as its current source for one kind of test, or using the power in a line circuit for the other kind of test.

A further object is to provide a tester which is primarily usable for connection with the flashlight for tests using the battery power thereof, yet convertible by a simple addition for use without the flashlight to receive power from a line circuit for testing interruptions or defects therein.

A better understanding of the invention may be gained by reference to the accompanying drawing, in which FIG. 1 is a full-sized view of the tester as applicable to a flashlight, of which only the end-portions are shown;

FIG. 2 is a view of one end-portion of the tester apart from the flashlight and converted for line-circuit use;

FIG. 3 is a section of a jack plug forming the basic part of the tester as applied to a flashlight battery circuit, as shown in schematic form;

FIG. 4 is an enlarged longitudinal section of the converted portion of the tester;

FIG. 5 is a more magnified section on the line 5 — 5 of FIG. 4; and

FIG. 6 is a diagram of a power line circuit showing the application of the tester.

Referring specifically to the drawing, 10 denotes a flashlight designed for test use. For this purpose the rear end of the flashlight is formed as a socket 10b to receive a jack plug 11 leading rearwardly into a pair of wiring cords 12a and 12b. The jack plug has an end-plug 11a, a neck 11b behind the same, and an insulator 11c; and it is designed to tap into the battery circuit when plugged into the flashlight socket as indicated by FIG. 1, so that the cords 12a will receive current from the battery as a current source. Jacks applied to a flashlight in the manner just described are well-known testers as shown in the aforementioned patents; and FIG. 3 shows how a jack plug taps into the battery circuit of the flashlight. Thus, the end-plug 11a — leading to one wiring cord 12a as seen in the right-hand end of FIG. 4— receives current from the one terminal 13 of the battery circuit through contact 10c in socket 10b, while the outer sleeve 11d of the jack plug — leading similarly to the other wiring cord 12b — receives current from the other terminal 14 of the battery circuit through contact 10b; and the insulator 11c extends between and along the end-plug 11a and the sleeve 11d.

The lower part of FIG. 1 shows that the outer ends of the cords carry standard contact clips 15. Thus, when these are applied to complete an outside circuit, the bulb in the flashlight will light if the circuit is uninterrupted. This is the operation of the tester with the flashlight as a current source.

The present invention makes it unnecessary to carry or use a flashlight for the testing of switches or other units in power lines for interruptions or defects. Now the jack plug 11, whose internal leads 11a and 11d are spaced by the insulator 11c as mentioned before, cannot serve without a bridge or connection for such leads. However, such a facility is procured in the present invention in the form of an attachment which is small, simple, readily fitted to the jack plug 11, and illustrated in FIGS. 4 and 5.

The attachment just referred to is mainly a metal tube 16 having a longitudinal split 16a in one side and designed for tensioned mounting on the jack plug 11 when slid from the left to the position noted in FIG. 4; and the tube has its trailing end inturned as seen at 16b, to form a stop for the advance of the tube as states. Also, FIGS. 4 and 5 show that the tube has an indentation 16c adjacent to the split, which seats in the neck 11b of the jack plug as the tube reaches the advanced position. The inturned portion and the indentation therefore fix the fitted position of the tube on the jack plug; and by its grip thereon the tube bridges its leads 11a and 11d, so that current in one cord 12 will travel into the jack plug and return into the other cord. Finally, the fitted tube is protected by a cap 17 of soft rubber or plastic material, which is mounted with a snug fit to enclose the tube 16 and the forepart of the jack plug as seen in FIG. 2.

The tester, converted as just described, is now suitable for testing switches or other units in power lines. A circuit is shown in FIG. 5 including a motor 18 and a series of switches 19, 10 and 21, all presumably closed and effective to operate the motor 18. However, if the motor will not run, a defect should occur in one of the switches. To find out which switch is defective, one lead clip 15 is applied to the power line at a point such as indicated at 22, while the other clip is applied to the remote terminal of the switch 19. If this switch is in order the tester will produce no change, and the motor will not start. The same clip is then applied similarly to the switch 20, as indicated by the dot-and-dash line. If the effect is the same, it will prove that this switch also is in order. However, if the clip is applied to the switch 21, as indicated by the finely dotted line, and the motor starts to run, it will prove that the tester operated as a shunt or "jumper" to complete the circuit, and that the switch 21 is the defective one.

It is now apparent that the present tester is usable with the flashlight for one form of testing, and convertible to another form by the simple application of an end-tube, which converts the tester into a shunt or "jumper" for testing switches or other units in a power line without the need of a flashlight or battery; and the end-tube is small and usually carried on the jack plug, its cap enclosure 17 serving as a protector against the entry of dust or other foreign matter apt to impair the efficiency of the tester.

I claim:

1. Shunt means for a circuit tester comprising a pair of flexible, electrically conductive probes with an input terminal on one end of each probe and a single jack plug having two conductors arranged therein in an electrically insulated relationship to provide two spaced output terminals on one end portion of said jack plug, the other end of each probe being inserted into the other end portion of said jack plug with one of said probe other ends being connected to one of said conductors and the other end of the other probe being connected to the other of said conductors; said shunt means comprising a tubular element of the electrically conductive material to slidably receive and retain in frictional engagement at least the end portion of said jack plug having said output terminals, said tubular element being longitudinally split, one end of said tubular element being crimped inwardly to provide a stop for the terminal output end portion of said jack plug when inserted therein with one of said output terminals in contact with said element, said stop being in contact with the other of said terminal outputs to thereby provide a closed circuit between said output terminals, and a detent formed on an edge of said longitudinal split adjacent said crimped end to receive a notched depression in the terminal output end of said jack plug to retain said jack plug within said tubular element, being a non-conductive covering for said tubular element including enclosing of the crimped end of said element, said jack plug being of a type insertable into a flash light having a switch activated, battery-operated circuit connected to a receptacle to receive said jack plug.

* * * * *